(12) United States Patent
Lenchenkov

(10) Patent No.: US 12,205,966 B1
(45) Date of Patent: Jan. 21, 2025

(54) SENSOR WITH LONG WAVELENGTH INFRARED POLARIZATION SENSITIVE PIXELS

(71) Applicant: SONY SEMICONDUCTOR SOLUTIONS CORPORATION, Kanagawa (JP)

(72) Inventor: Victor A. Lenchenkov, Rochester, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/235,991

(22) Filed: Aug. 21, 2023

(51) Int. Cl.
*H01L 27/146* (2006.01)

(52) U.S. Cl.
CPC .. *H01L 27/14607* (2013.01); *H01L 27/14623* (2013.01); *H01L 27/14627* (2013.01)

(58) Field of Classification Search
CPC ......... H01L 27/14607; H01L 27/14623; H01L 27/14627
See application file for complete search history.

(56) References Cited

U.S. PATENT DOCUMENTS

| | | | |
|---|---|---|---|
| 3,971,065 A | 7/1976 | Bayer | |
| 8,330,840 B2 | 12/2012 | Lenchenkov | |
| 9,349,770 B2 | 5/2016 | Lenchenkov | |
| 11,385,104 B2 | 7/2022 | Yao et al. | |
| 11,644,606 B1 * | 5/2023 | Lenchenkov | H04N 25/11 348/222.1 |
| 2002/0167727 A1 * | 11/2002 | Hansen | G02B 5/3058 359/489.05 |
| 2010/0164031 A1 * | 7/2010 | Shin | H01L 27/14685 257/E31.127 |
| 2011/0032398 A1 * | 2/2011 | Lenchenkov | H01L 27/14621 257/E31.127 |
| 2012/0287297 A1 * | 11/2012 | Fukuda | H01L 27/1464 257/E31.127 |
| 2013/0221466 A1 * | 8/2013 | Ooka | H01L 31/02327 257/432 |
| 2018/0233530 A1 | 8/2018 | Lenchenkov et al. | |
| 2020/0013819 A1 * | 1/2020 | Toda | H01L 27/14643 |
| 2020/0152683 A1 * | 5/2020 | Akiyama | H01L 27/14647 |

(Continued)

FOREIGN PATENT DOCUMENTS

JP 2015-095879 5/2015

*Primary Examiner* — Thanh Luu
*Assistant Examiner* — Monica T Taba
(74) *Attorney, Agent, or Firm* — SHERIDAN ROSS P.C.

(57) ABSTRACT

Long wavelength polarization sensitive image sensor devices and methods are provided. The image sensor includes pixels that each include a plurality of sub-pixels. At least some of the sub-pixels within each pixel are associated with a grid structure. Each grid structure includes two or more linear grid elements that are parallel to one another. The grid elements are disposed directly on a light incident surface of a sensor substrate in which the sub-pixels are formed, and are electrically floating. The sub-pixels can be formed as photodiodes in a silicon or other semiconductor substrate. Infrared light incident on the pixels results in the heating of the grid elements, and in particular of grid elements oriented in a direction that is parallel to a polarization of the incident light, which in turn generates a current in associated a sub-pixels. A polarization state and intensity of the incident light can be determined.

19 Claims, 9 Drawing Sheets

(56) References Cited

U.S. PATENT DOCUMENTS

2020/0173911 A1    6/2020  Kojima et al.
2021/0190593 A1*   6/2021  Yao ..................... G02B 5/3025
2021/0266431 A1    8/2021  Lenchenkov

* cited by examiner

SENSOR WITH LONG WAVELENGTH INFRARED POLARIZATION SENSITIVE PIXELS

FIELD

The present disclosure relates to a sensor device that is operable to detect the polarization of incident light at infrared wavelengths. The sensor device includes one or more pixels incorporating a plurality of sub-pixels and a plurality of grids in which each grid is disposed on a light incident surface side of a corresponding one of the sub-pixels.

BACKGROUND

Digital light sensors, including but not limited to image sensors, are commonly used in a variety of electronic devices, such as scientific instruments, handheld cameras, security systems, telephones, computers, and tablets, to detect light. In a typical arrangement, light sensitive areas or pixels are arranged in a two-dimensional array having multiple rows and columns of pixels, and are operated to capture images. Each pixel generates an electrical charge in response to receiving photons as a result of being exposed to incident light. For example, each pixel can include a photodiode that generates charge in an amount that is generally proportional to the amount of light (i.e. the number of photons) incident on the pixel during an exposure period. The charge can then be read out from each of the pixels, for example through peripheral circuitry.

In conventional image sensors, individual pixels generate charge in response to the receipt of incident light. The amount of charge generated by a pixel is dependent on the amount of light received at the pixel during an exposure period. In particular, in a typical image sensor, the receipt of photons at a pixel results in the generation of electron-hole pairs, creating a charge that is read out by the image sensor to provide an indication of a quantity of light incident on the pixel. The wavelengths of photons that are effective at generating a quantity of charge in a sensor is dependent on the materials used to form the sensor. For example, a typical sensor having pixels configured as photodiodes formed in a silicon substrate is limited to sensing light at wavelengths of less than 1000 nm, due to the band gap limitation of silicon. Accordingly, long wavelength (>1000 nm) infrared light is not sensed in a typical silicon based sensor. Materials other than silicon can be used to form photodiodes that are sensitive to light at longer wavelengths. However, such alternative materials can generate greater amounts of noise, can be more expensive, and can be more difficult to handle as compared to silicon.

Image sensors can be configured to detect different characteristics of light. For example, in order to sense color, absorptive color filters are used to enable the image sensor to detect the color of incident light. The color filters are typically disposed in sets (e.g. of red, green, and blue (RGB); cyan, magenta, and yellow (CMY); or red, green, blue, and infrared (RGBIR)). As another example, a light sensor can be configured to detect the polarization of incident light by disposing metal diffraction gratings within or on top or an insulating layer and/or a filter layer disposed over individual pixels. Incident light having a polarization that is perpendicular to the grating lines is diffracted through the grating and reaches the pixel with little loss. Incident light having a polarization that is parallel to lines of the grating is absorbed and does not reach the pixel. By providing gratings with different line orientations over different pixels, the polarization of light incident on a sensor can be determined. However, such a configuration remains limited to operation at the operable wavelengths of the pixels themselves. In addition, because of the light blocking effect of the gratings, the sensitivity of the sensor is reduced.

Conventional sensors typically incorporate non-complementary metal-oxide semiconductor (CMOS), polymer-based materials, for example to form filters and micro lenses for each of the pixels, resulting in image sensor fabrication processes that are more time-consuming and expensive than processes that only require CMOS materials. Moreover, the resulting devices suffer from compromised reliability and operational life, as the included filters and micro lenses are subject to weathering and performance that degrades at a much faster rate than inorganic CMOS materials.

Accordingly, it would be desirable to provide a sensor capable of sensing the polarization of long infrared wavelength light, and that could be produced relatively easily.

SUMMARY

Embodiments of the present disclosure provide sensors, methods of sensing, and methods of producing sensors capable of sensing infrared light, and further that are capable of sensing a polarization of incident infrared light. In accordance with embodiments of the present disclosure, sensors as disclosed herein include one or more pixels, with each pixel including a plurality of sub-pixels formed as photodiodes in a substrate. Grid structures are disposed on a light incident side of at least some of the sub-pixels. Each of the grid structures can include grid elements disposed in a selected orientation. A comparison of signals read out from different sub-pixels enables a polarization state of incident infrared light to be identified.

The grid structures can be configured with a number of thin, linear, light absorptive grid elements that are disposed on a light incident surface side of a substrate in which the sub-pixels or photodiodes are formed. The grid elements are electrically floating. In accordance with at least some embodiments of the present disclosure, the grid elements are disposed directly on a light incident surface of the substrate in which the photodiodes are formed. Accordingly, the grid elements can be formed at the interface between the substrate in which the photodiodes are formed, such as a silicon substrate, and an overlaying insulating layer, such as a silicon oxide layer. The grid elements can include a conductive material, such as a metal, a metal silicide, a silicide, or a hybrid material. In accordance with further embodiments of the present disclosure, at least one sub-pixel within a pixel can be associated with a light shielding member, while a plurality of other sub-pixels within the pixel can be associated with grid structures including parallel grid elements that, within a selected grid structure, have a common orientation.

An imaging device or apparatus incorporating an image sensor in accordance with embodiments of the present disclosure can include an imaging lens that focuses collected light onto an image sensor. The light from the lens can be focused and diffracted onto pixels included in the image sensor by micro lenses. Alternatively, micro lenses need not be included as part of the imaging device. Each pixel of the image sensor includes a plurality of sub-pixels. Each sub-pixel can be provided as a photodiode formed in a semiconductor substrate, including but not limited to a silicon substrate. At least some of the sub-pixels within a pixel can be associated with a conductive grid structure that is disposed directly on the substrate in which the photodiodes are formed. Each grid structure can include a plurality of linear grid elements disposed in one of a plurality of selected orientations. Light collected by the imaging lens that is incident on image sensor heats the grid structures. In addition to the intensity and wavelength of the incident light, the amount of heating of an individual grid structures depends on the orientation of that grid structure and the polarization of the incident light. That heating results in the generation of electron-hole pairs within the photodiode associated with the grid structure, and the quantity of charge thus generated can be sensed and read out. By determining an amount of charge generated within the different sub-pixels of a pixel, the polarization of the light incident on the pixel and/or the intensity of the light incident on the pixel can be determined.

In accordance with embodiments of the present disclosure, the assignment of a polarization angle to light incident on a pixel includes determining ratios of signal strengths produced by sub-pixels within the pixel and solving a system of equations using calibrated ratios. Alternatively, the polarization angle of the light incident on a pixel can be determined by applying determined ratios of signal strengths produced by sub-pixels within the pixel to a table of ratios and associated polarizations. The amplitude or intensity of the light incident on the pixel is the sum of all of the signals from the sub-pixels included in that pixel. In addition, at least one sub-pixel within a pixel can be associated with a light shield, enabling the amount of dark current produced independently of heating of the grid structures to be determined, which in turn allows the intensity of the light incident on the pixel to be determined with improved accuracy. An image sensor produced in accordance with embodiments of the present disclosure does not require micro lenses for each pixel. In addition, an image sensor in accordance with embodiments of the present disclosure does not require wavelength selective filters, and provides high sensitivity over a range of wavelengths that extends well into the infrared (e.g. up to 10 microns), beyond the normal wavelength sensitivity range of photodiodes formed using conventional silicon substrates.

Additional features and advantages of embodiments of the present disclosure will become more readily apparent from the following description, particularly when considered together with the accompanying drawings.

DETAILED DESCRIPTION

Figure 1:
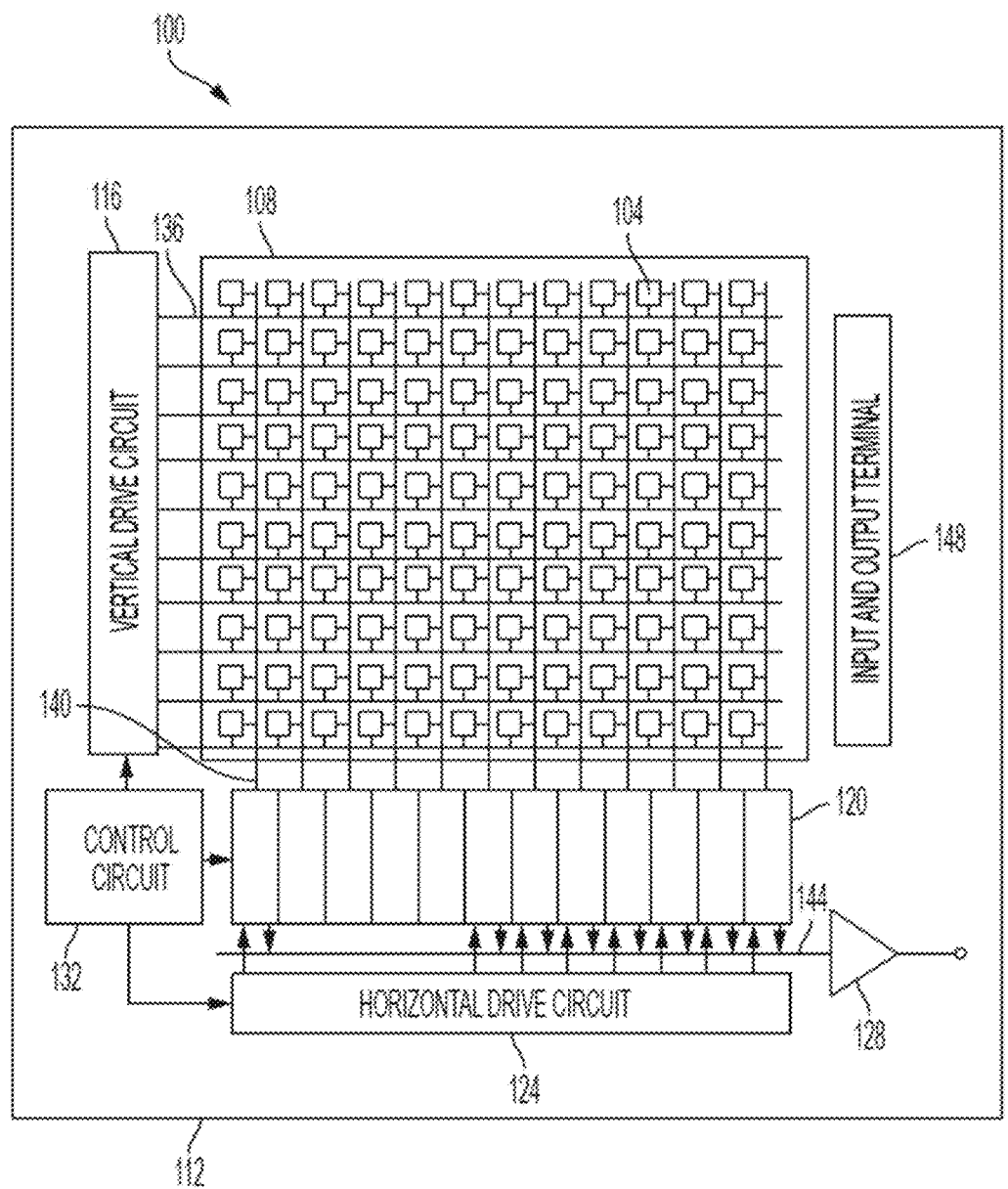
FIG. 1 depicts elements of an image sensor that is operable to detect the polarization of incident light at infrared wavelengths in accordance with embodiments of the present disclosure.

FIG. 1 is a diagram that depicts elements of an image sensor or device 100 with long wavelength (infrared) polarization sensitive pixels in accordance with embodiments of the present disclosure. In general, the long wavelength polarization sensitive image sensor 100 includes a plurality of pixels 104 disposed in an array 108. More particularly, the pixels 104 can be disposed within an array 108 having a plurality of rows and columns of pixels 104. Moreover, the pixels 104 are formed in a sensor substrate 112. In addition, one or more peripheral or other circuits can be formed in connection with the sensor substrate 112. Examples of such circuits include a vertical drive circuit 116, a column signal processing circuit 120, a horizontal drive circuit 124, an output circuit 128, and a control circuit 132. As described in greater detail elsewhere herein, each of the pixels 104 within a long wavelength polarization sensitive image sensor 100 in accordance with embodiments of the present disclosure includes a plurality of photosensitive sites or sub-pixels in the form of photodiodes.

The control circuit 132 can receive data for instructing an input clock, an operation mode, and the like, and can output data such as internal information related to the image sensor 100. Accordingly, the control circuit 132 can generate a clock signal that provides a standard for operation of the vertical drive circuit 116, the column signal processing circuit 120, and the horizontal drive circuit 124, and control signals based on a vertical synchronization signal, a horizontal synchronization signal, and a master clock. The control circuit 132 outputs the generated clock signal in the control signals to the various other circuits and components.

The vertical drive circuit 116 can, for example, be configured with a shift register, can operate to select a pixel drive wiring 136, and can supply pulses for driving sub-pixels of a pixel 104 through the selected drive wiring 136 in units of a row. The vertical drive circuit 116 can also selectively and sequentially scan elements of the array 108 in units of a row in a vertical direction, and supply the signals generated within the pixels 104 according to an amount of infrared light they have detected to the column signal processing circuit 120 through a vertical signal line 140.

The column signal processing circuit 120 can operate to perform signal processing, such as noise removal, on the signal output from the pixels 104. For example, the column signal processing circuit 120 can perform signal processing such as a correlated double sampling (CDS) for removing a specific fixed patterned noise of a selected pixel 104 and an analog to digital (A/D) conversion of the signal.

The horizontal drive circuit 124 can include a shift register. The horizontal drive circuit 124 can select each column signal processing circuit 120 in order by sequentially outputting horizontal scanning pulses, causing each column signal processing circuit 122 to output a pixel signal to a horizontal signal line 144.

The output circuit 128 can perform predetermined signal processing with respect to the signals sequentially supplied from each column signal processing circuit 120 through the horizontal signal line 144. For example, the output circuit 128 can perform a buffering, black level adjustment, column variation correction, various digital signal processing, and other signal processing procedures. An input and output terminal 148 exchanges signals between the image sensor 100 and external components or systems.

Accordingly, at least portions of a long wavelength polarization sensing image sensor 100 in accordance with at least some embodiments of the present disclosure can be configured, for example, as a CMOS image sensor of a column A/D type in which column signal processing is performed.

Figure 2A:
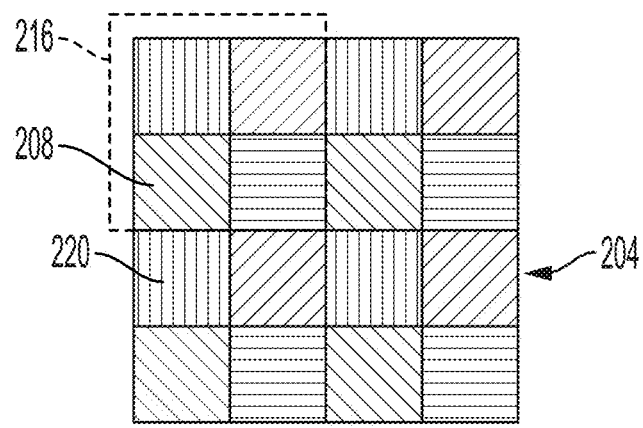
FIG. 2A is top plan view of a portion of a polarization sensitive image sensor in accordance with the prior art.
Figure 2B:
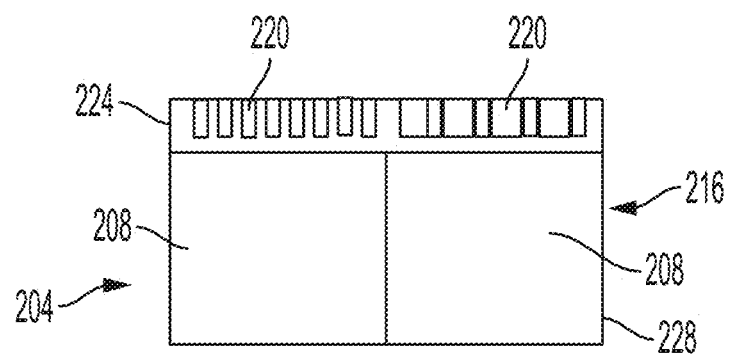
FIG. 2B is cross-section in elevation of a portion of a polarization sensitive image sensor in accordance with the prior art.

FIG. 2A depicts a portion of a pixel array 204 of an exemplary polarization sensing image sensor in accordance with the prior art in a plan view, and FIG. 2B depicts a portion of the pixel array 204 in a cross-section in elevation. In this example pixel array 204, individual pixels 208 are disposed in 2×2 sets 216 of four pixels 208 each. A set of wire grid or metal grating polarizers 220 are disposed in or on an insulating layer 224 on a light incident surface side of a sensor substrate 228 in which the pixels 208 are formed. Accordingly, the wire grids 220 are spaced apart from the sensor substrate 228. Each wire grid polarizer 220 is configured to diffract light polarized in a direction perpendicular to the included wires, and to absorb light polarized in a direction parallel to the included wires. In addition, the wire grids 220 extend across all of a light incident surface area of the pixels 208. In this example, each the four pixels 208 in the sets 216 are overlaid by a wire grid or metal grating polarizer 220 having a different orientation. More particularly, a first one of the pixels 208 is associated with a wire grid polarizer 220 oriented at a 90 degree angle relative to a reference line, a second one of sub-pixels 208 is associated with a wire grid polarizer 220 oriented at a 45 degree angle to the reference line, a third one of the sub-pixels 208 is associated with a wire grid polarizer 220 oriented at a 135 degree angle to the reference line, and fourth one of the sub-pixels 208 is associated with a wire grid polarizer 220 oriented at a 0 degree angle to the reference line.

As can be appreciated by one of skill in the art, a wire grid polarizer 220 reflects and absorbs light polarized in a direction that is parallel to the wires, and passes light polarized in a direction that is perpendicular to the wires. Accordingly, photons within light having a polarization that is perpendicular to the wires of a wire grid polarizer 220 are passed to the underlying photo sensor of the pixel, resulting in the generation of an electrical charge by the photoelectric effect. Photons within light having a polarization that is parallel to the wires of a wire grid polarizer are reflected or absorbed, and do not cause an electrical charge to be generated. The average polarization and the intensity of the incident light across a set 216 of pixels 208 can then be determined by comparing the amount of charge generated by the different pixels 208 included in that set 216. However, the use of wire grid polarizers 220 reduces the amount of light incident on the associated pixel 208. In addition, such a sensor does not detect light at wavelengths beyond the band gap of the substrate material used to form the pixels 208. For example, where the substrate is silicon, the pixels 208 do not detect light at wavelengths longer than about 1000 nm.

Figure 3:
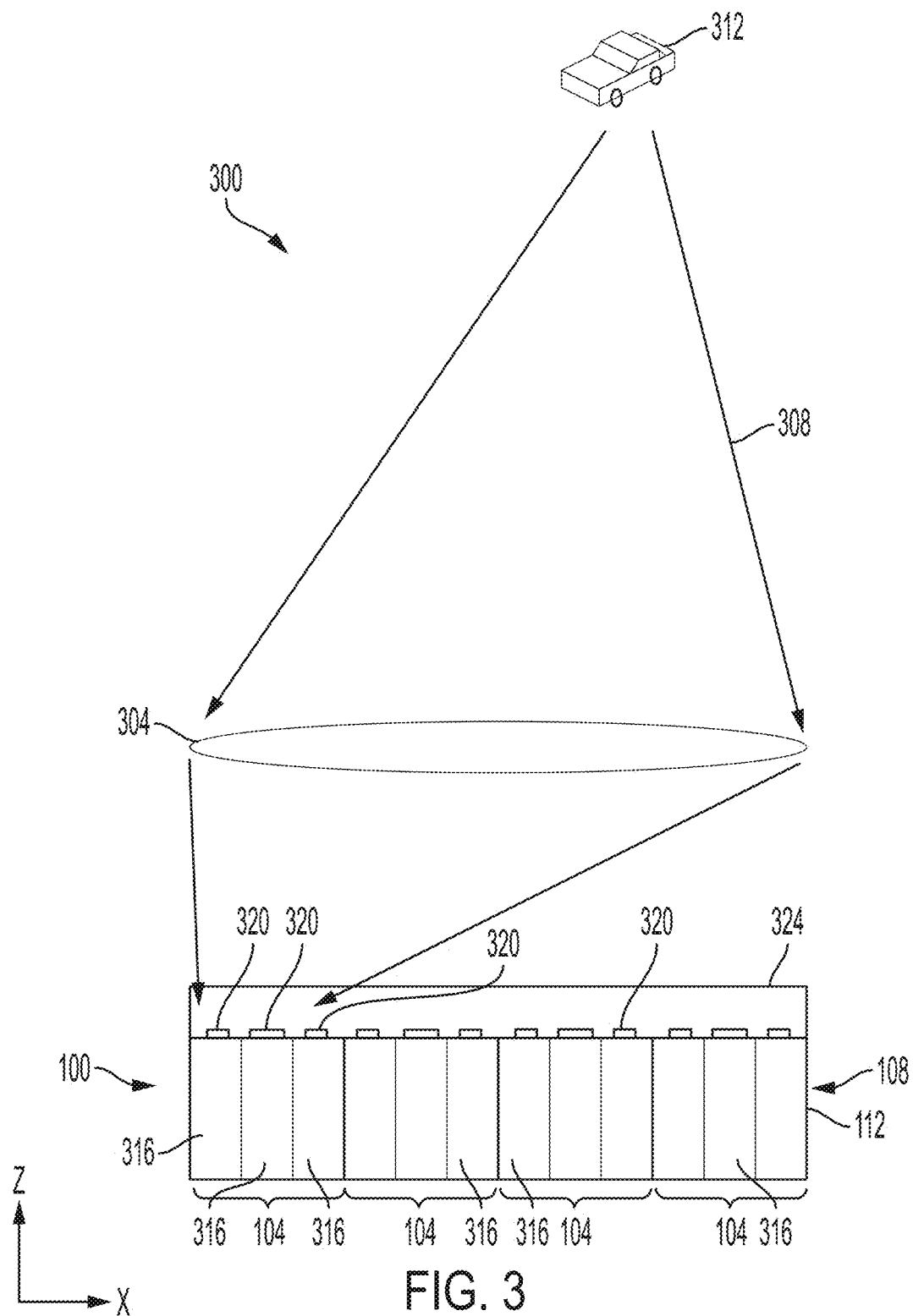
FIG. 3 depicts components of a system incorporating an image sensor operable to detect the polarization of incident light at infrared wavelengths in accordance with embodiments of the present disclosure.

FIG. 3 depicts components of a sensor system 300 incorporating a long wavelength polarization sensitive image sensor 100 in accordance with embodiments of the present disclosure, in a cross section view. As shown, the sensor system 300 can include an optical system 304 that collects and focuses light, including light 308 reflected or otherwise received from an object 312 within the field of view of the sensor system 300, onto pixels 104 included in the pixel array 108 of the image sensor 100. As can be appreciated by one of skill in the art after consideration of the present disclosure, the optical system 304 can include any number of lenses, mirrors, apertures, shutters, filters or other elements. In accordance with embodiments of the present disclosure, the pixels 104 of the pixel array 108 each include a plurality of sub-pixels 316 formed as individual photodiodes in the sensor substrate 112. In accordance with embodiments of the present disclosure, the pixels 104 include grid structures 320 disposed directly on a light incident surface of the substrate 112 in which the sub-pixels 316 are formed. As discussed in greater detail elsewhere herein, the grid structures 320 can have selected orientations, enabling the pixels 104 to detect the polarization and intensity of long wavelength light (e.g. light having a wavelength of 1000 nm or greater). The grid structures 320 may be formed directly on a light incident surface of the sensor substrate 112. The grid structures 320 and the light incident surface of the sensor substrate 112 can be overlaid by an insulating layer 324. In accordance with at least some embodiments of the present disclosure, the sensor substrate 112 is a silicon substrate and the insulating layer 324 is a silicon oxide layer.

Figure 4:
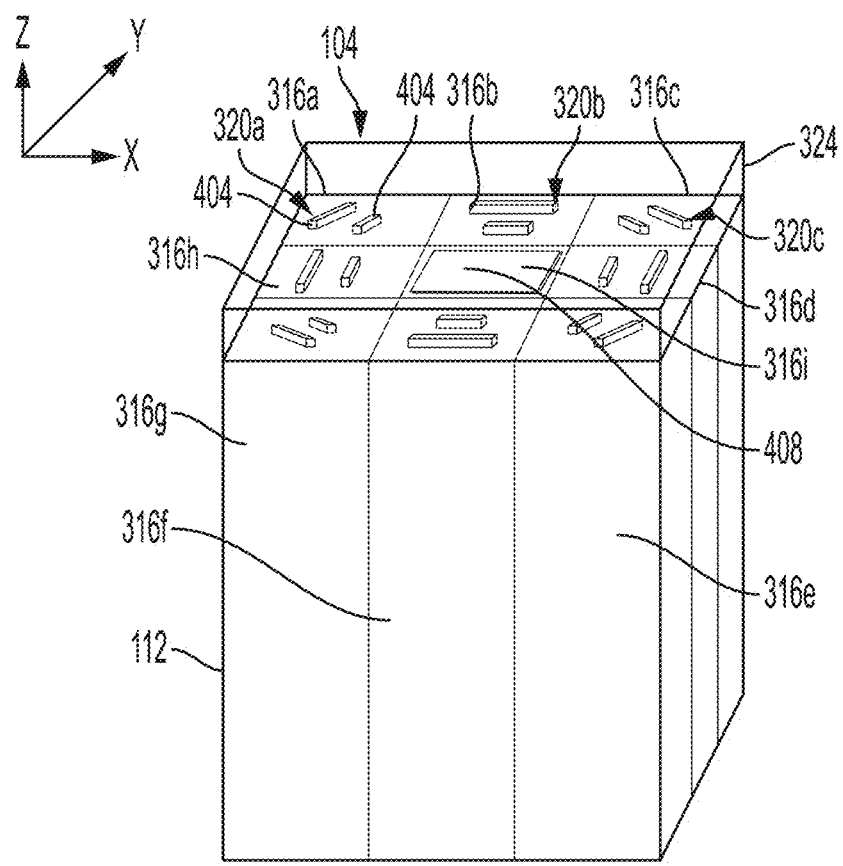
FIG. 4 is a perspective view of a pixel of an image sensor in accordance with embodiments of the present disclosure.
Figure 5:
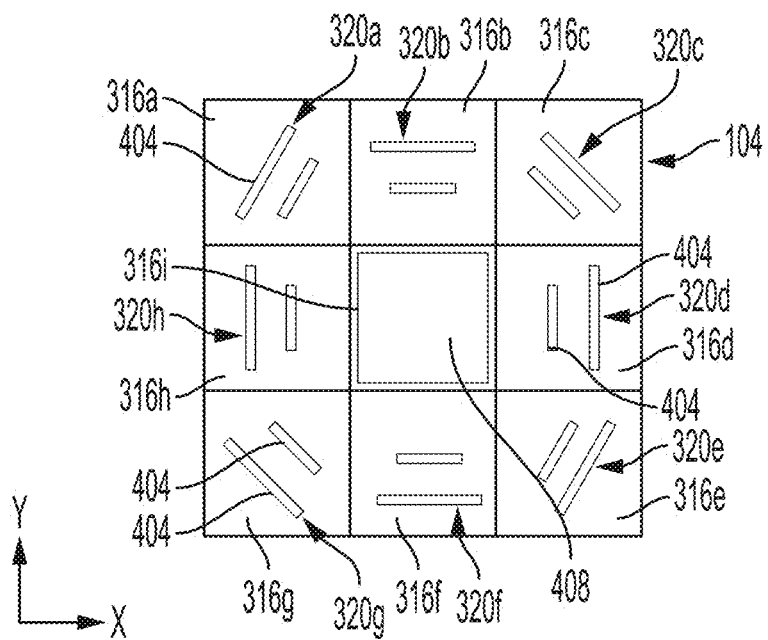
FIG. 5 is a top plan view of a pixel of an image sensor in accordance with embodiments of the present disclosure.
Figure 6A:
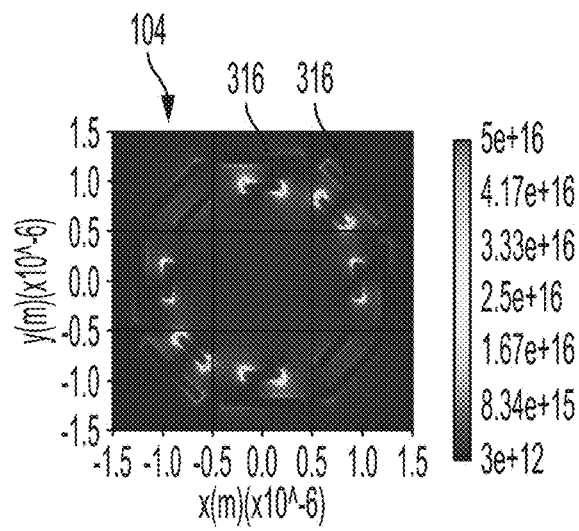
FIGS. 6A-6D depict the absorption of polarized light by metal grids of sub-pixels of the example pixel of FIG. 5.
Figure 6B:
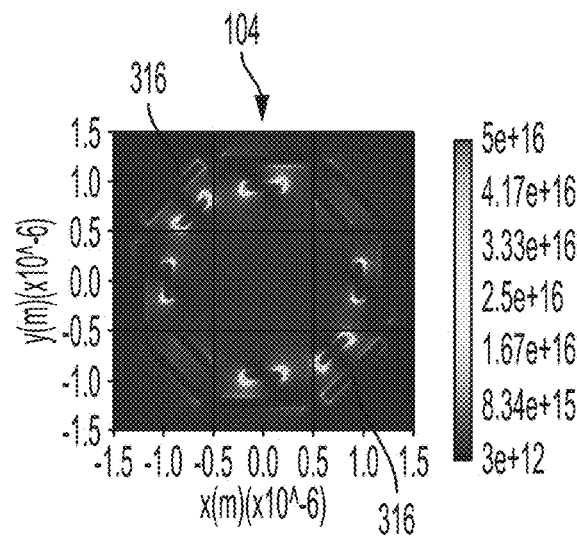
Figure 6C:
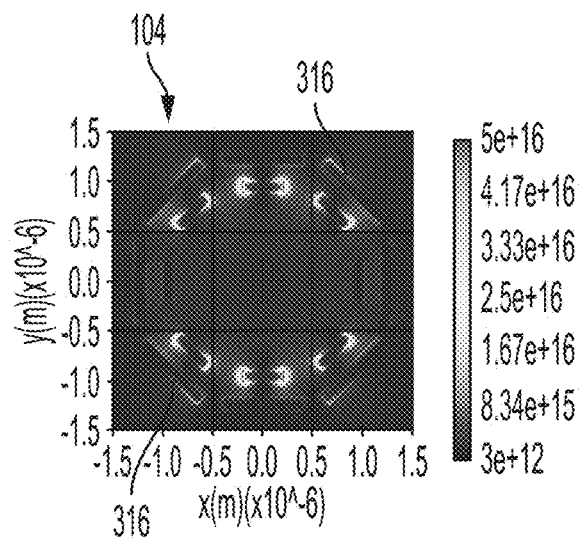
Figure 6D:
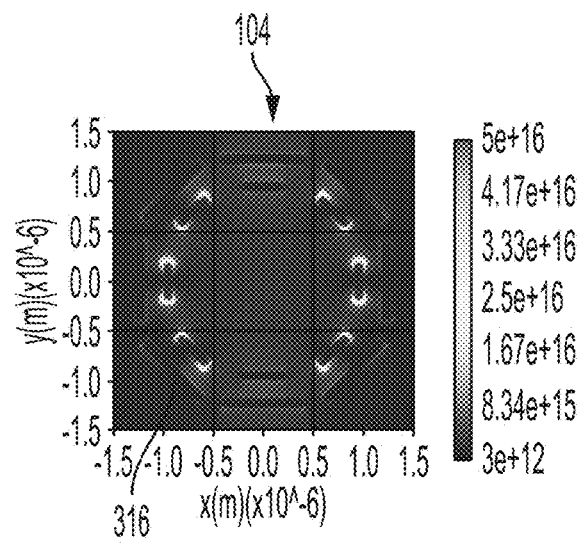

FIGS. 4 and 5 are perspective and top plan views respectively of a pixel 104 included in a long wavelength polarization sensitive image sensor 100 in accordance with embodiments of the present disclosure. As shown, the pixel 104 includes a plurality of sub-pixels 316. In this example, the pixel 104 includes 9 sub-pixels 316 disposed in a 3×3 array. However, a pixel 104 can include any number of sub-pixels 316. At least some of the sub-pixels 316 are associated with a grid structure 320. In particular, in the illustrated example, eight of the nine sub-pixels 316 are associated with a grid structure 320.

Each grid structure 320 can include one or more linear grid elements 404, with each grid element 404 within any one grid structure 320 configured as a linear element aligned in the same direction. In this example, a first one of the sub-pixels 316*a* is associated with a first grid structure 320*a* aligned at 45 degrees relative to a reference line (in the figure the reference line is parallel to the X axis); a second one of the sub-pixels 316*b* is associated with a second grid structure 320*b* aligned at 0 degrees relative to the reference line; a third one of the sub-pixels 316*c* is associated with a third grid structure 320*c* aligned at 135 degrees relative to the reference line; a fourth one of the sub-pixels 316*d* is associated with a fourth grid structure 320*d* aligned at 90 degrees relative to the reference line; a fifth one of the sub-pixels 316*e* is associated with a fifth grid structure 320*e* aligned at 45 degrees relative to the reference line; a sixth one of the sub-pixels 316*f* is associated with a sixth grid structure 320*f* aligned at 0 degrees relative to the reference line; a seventh one of the sub-pixels 316*g* is associated with a seventh grid structure 320*g* aligned at 135 degrees relative to the reference line; and an eighth one of the sub-pixels 316*h* is associated with an eighth grid structure 320*h* aligned at 90 degrees relative to the reference line. In this example, a ninth sub-pixel 316*i* is associated with and overlaid by a light shielding member 408. Accordingly, the light shielding member 408 can be disposed adjacent to an area of an associated sub-pixel and enables an amount of a dark current within portions of a pixel 104 generated independently of the heating of grid elements 404 to be determined. Moreover, in this example the sub-pixel 316*i* associated with the light shielding member 408 is surrounded by sub-pixels 316*a-h* that are each associated with a corresponding grid structure 320*a-h*.

The grid elements 404 of the grid structures 320 can be formed from any electrically conductive material. For example, the grid elements 404 can be formed from a metal, a transition metal, a silicide, a metal silicide, or a hybrid material. As particular examples, the grid elements 404 can be formed from a metal such as tungsten, titanium, nickel, cobalt, silver, chromium etc.; or a metal silicide, such as tungsten silicide, cobalt silicide, nickel silicide, etc., which all have high absorption coefficients. Therefore, such materials can easily absorb incident light having a wavelength of greater than 1.0 μm, including but limited to light within a wavelength range of 1.5-10 μm. In addition, the grid elements 404 can be disposed directly on a light incident surface of the sensor substrate 112. Moreover, the grid elements 404 are electrically floating and are electrically independent of one another (i.e. they are not electrically connected to one another. In accordance with further embodiments of the present disclosure, the grid elements 404 can be coated with an anti-reflection material, to enhance absorption of incident light and therefore heating of the grid elements 404 and the local heating of the underlying sub-pixel 316.

The number and configuration of the grid elements 404 within a grid structure 320 can be selected based on the intended application for the image sensor 100. As an example, but without limitation, each grid structure 320 can include from 2 to 20 parallel grid elements 404. As another example, each grid structure 320 can include two or three parallel grid elements 404. As can be appreciated by one of skill in the art after consideration of the present disclosure, a relatively large number of grid elements 404 results in reduced sensitivity but increases the extinction ratio, while a relatively small number of grid elements 404 results in increased sensitivity but reduces the extinction ratio. Each grid element 404 can be configured as a thin line of material on a light incident surface of the substrate 112 in which the photodiodes or sub-pixels 316 are formed.

Notably, the mechanism by which the grid structures 320 of embodiments of the present disclosure enable the detection of a polarization of incident light is different than that of prior art polarization sensitive devices. Specifically, because the grid elements 404 of the grid structures 320 are electrically floating, energy imparted to those grid elements 404 by photons in incident light is dissipated by readmission (a relatively slow process) or heating of the grid elements 404 and in turn of the underlying silicon substrate (a relatively fast process). The heating of the underlying silicon substrate 112 results in the generation of electron-hole pairs in the photodiode of the underlying sub-pixel 316 formed in the sensor substrate 112 in or around the area of the grid elements 404. The resulting current is then sensed. The heating of the grid elements 404 of a grid structure 320 for a given intensity is greatest where the incident light has a polarization that is parallel to the direction of the grid elements 404, and is least where the incident light has a polarization that is perpendicular to the direction of the grid elements 404. As can be appreciated by one of skill in the art after consideration of the present disclosure, light at infrared wavelengths (e.g. at wavelengths equal to or greater than 1000 nm) has a greater heating effect of the electrically conductive lines than light at shorter wavelengths. Moreover, this heating and subsequent generation of electron hole pairs is independent of the typical photoelectric effect used to sense light in a prior art polarization sensitive sensor. This unique mechanism therefore is not subject to the bandgap limitations of the sensor substrate 112, and enables the sensing of light at long wavelengths.

The different orientations of the different grid structures 320 allows the polarization of incident light to be detected by the pixel 104. With reference now to FIGS. 6A-6D, the absorption of polarized light by grid structures 320 of a pixel 104 in accordance with embodiments of the present disclosure, which is generally proportional to the amount of charge generated by heating the substrate 112 in which sub-pixels 316 underlying the grid structures 320 are formed, is depicted. Note that the configuration of the grid structures 320 within the pixel 104 is the same as that depicted in FIGS. 4 and 5. Specifically, in FIG. 6A, the response to light polarized at an angle of 135 degrees is illustrated; in FIG. 6B, the response to light polarized at an angle of 45 degrees is illustrated; in FIG. 6C, the response to light polarized at an angle of 0 degrees is illustrated; and in FIG. 6D, the response to light polarized at an angle of 90 degrees is illustrated. In accordance with at least some embodiments of the present disclosure, the absorption of light polarized in a direction that is parallel to the direction of the long side of the grid structure 320 is about twice that of the absorption of that light by a grid structure 320 oriented in a direction that is perpendicular to the polarization direction of the light. The proportional response of the different sub-pixels 316 to the incident light allows the fraction of each different polarization state contributing to the overall polarization state of the incident light to be determined. The total intensity of the light incident on the pixel 104 can be determined from a sum of the signals from the included sub-pixels 316. The accuracy of the intensity determination can be increased where one of the sub-pixels is associated with a light shield 408, and therefore functions as a dark pixel that allows any dark current present in the pixel 104 that is independent of the dark current produced by the heating caused by the grid structures 320 to be subtracted from that sum.

Figure 7:
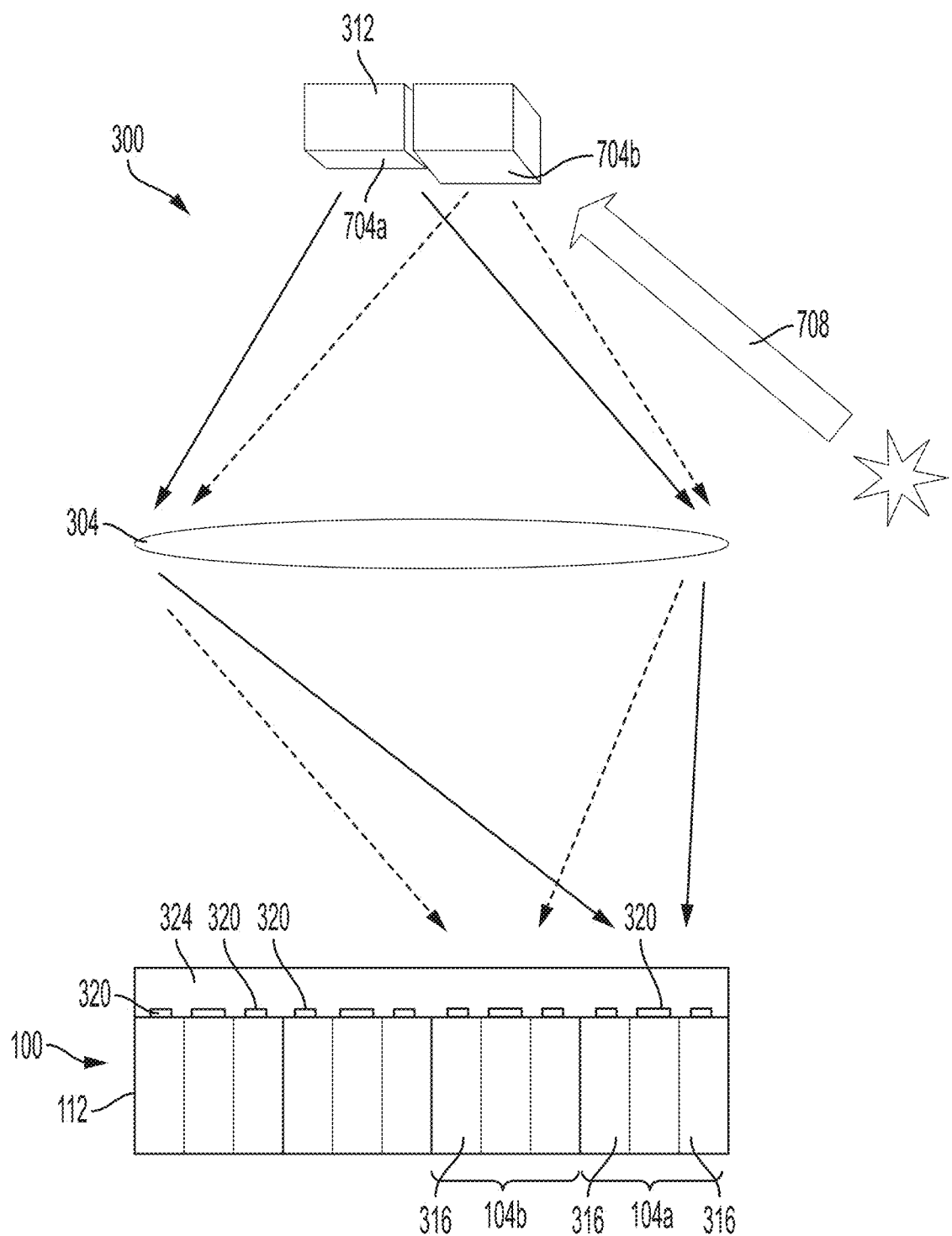
FIG. 7 depicts the detection of a three dimensional shape of an object by a system incorporating an image sensor operable to detect the polarization of incident light at infrared wavelengths in accordance with embodiments of the present disclosure.

FIG. 7 depicts the detection of a three-dimensional shape of an object by a system 300 incorporating a long wavelength polarization sensitive image sensor 100 operable to detect the polarization of incident light and infrared wavelengths in accordance with embodiments of the present disclosure. In particular, as a result of the illumination of surfaces 704*a* and 704*b* of an object 312 by unpolarized light 708, polarized light 712 is reflected, and that reflected and polarized light 712 is imaged by the imaging optics 304 onto the pixels 104 of the long wavelength polarization sensitive image sensor 100. The first object surface 704*a* in this example reflects more polarized light 712*a* than the second object surface 704*b*. Further, in this example the light 712*a* reflected by the first object surface 704*a* is imaged onto the sub-pixels 316 of a first pixel 104*a*, while the light 712*b* reflected by the second object surface 704*b* is imaged onto the sub-pixels 316 of a second pixel 104*b*. A comparison of the intensity of the polarization reflections received at the different pixels 104 as a function of the chief ray angle allows the three-dimensional shape of the object 312 to be deduced. Moreover, it should be appreciated that, as embodiments of the present disclosure provide a long wavelength polarization sensitive image sensor 100, the deduction of the three-dimensional shape of the object 312 can be performed where the reflected light 712 received by the image sensor 100 has a relatively long wavelength, for example in a wavelength range of from 1.5-10 µm.

Figure 8:
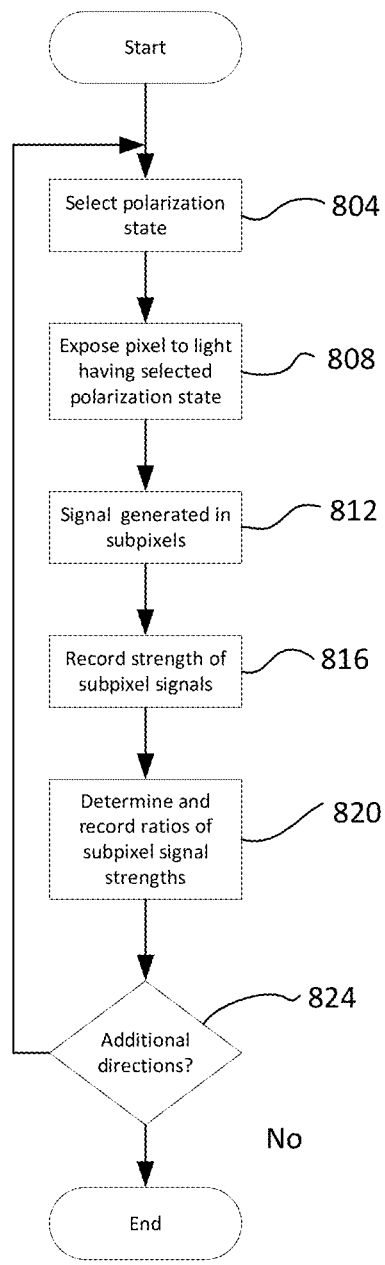
FIG. 8 depicts aspects of a process for calibrating a pixel of an image sensor in accordance with embodiments of the present disclosure.

With reference now to FIG. 8, aspects of a method for calibrating a pixel 104 of a long wavelength polarization sensitive image sensor 100 having sub-pixels 316 with grid structures 320 in accordance with embodiments of the present disclosure, to enable the polarization and intensity of long wavelength (e.g., a wavelength of greater than 1.0 µm) light incident on the pixel 104 to be determined, are presented. More particularly, in a pixel 104 having a 3×3 sub-pixel 604 configuration, thirty-six combinations of photodiode signal ratios are possible. By measuring the signal ratios of at least some of the possible combinations of the twelve sub-pixels 604 in a pixel 104 having a 3×3 sub-pixel 604 configuration, it is possible to measure a polarization and intensity of incident light. The calibration process includes selecting a polarization state (step 804) and exposing a pixel 104 to incident light having the selected polarization (step 808). For example, the pixel 104 may be exposed to light having a polarization angle of 0° relative to a reference line. The incident polarized light heats the grid elements 404, which in turn heats the underlying sub-pixels 316, in turn generating a dark current in those sub-pixels 316 (step 812). As can be appreciated by one of skill in the art after consideration of the present disclosure, the strength of the signal generated within a sub-pixel 316 associated with a grid structure 320 in which the grid elements 404 are parallel to the polarization direction of the incident light will be greater than in a sub-pixel 316 associated with a grid structure 320 in which the grid elements 404 are not parallel to the polarization direction of the incident light. The strength of the signals produced at each of the sub-pixels 316 is then recorded (step 816). At step 820, ratios of sub-pixel 316 signal strengths are determined from the collected values and recorded. Recording the obtained ratio values can include placing them in a table.

At step 824, a determination is made as to whether different polarization directions remain to be calibrated. If additional polarization directions remain to be calibrated, the process returns to step 804, where a next polarization direction is selected. For example, the process can proceed in steps of 22.5° of polarization angle. After a determination is made at step 824 that sub-pixel 316 signal strength ratios for all of the desired polarization directions have been obtained, the table of calibration values is complete, the process of calibration can end. As can be appreciated by one of skill in the art after consideration of the present disclosure, the calibration process can be performed for all of the pixels 104 within the image sensor 100 array 108, sequentially or simultaneously. Alternatively, the calibration process can be performed for a single, representative pixel 104. In accordance with still other embodiments, the calibration process can be performed for a single, representative pixel 104 in each of a plurality of areas or regions of the array 108. As can also be appreciated by one of skill in the art after consideration of the present disclosure, calibration of the pixels 104 of a long wavelength polarization sensitive image sensor 100 can be performed for light of different wavelengths and different intensities.

Figure 9:
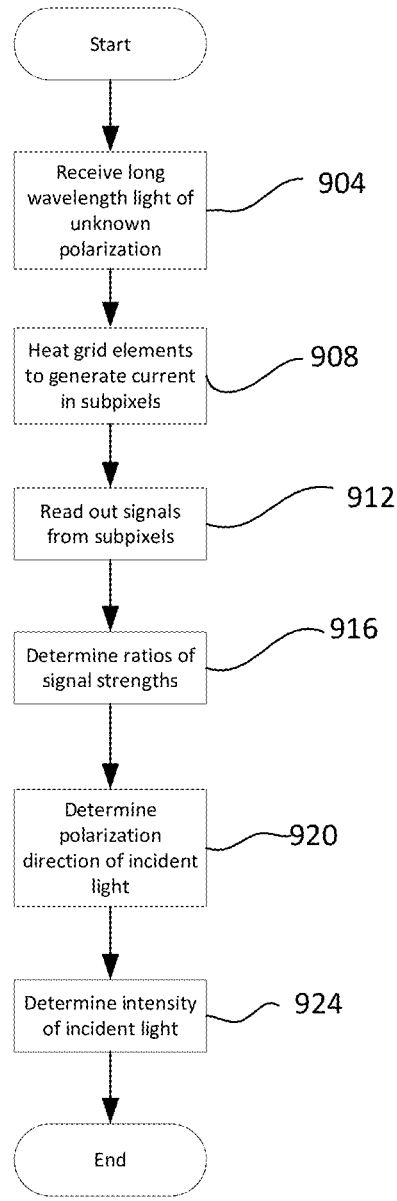
FIG. 9 depicts aspects of a process for determining a polarization of infrared light incident on an image sensor pixel in accordance with embodiments of the present disclosure.

With reference now to FIG. 9, aspects of a method for determining a polarization of light incident on a long wavelength polarization sensitive image sensor 100 pixel 104 configured and calibrated in accordance with embodiments of the present disclosure are presented. Initially, at step 904, long wavelength incident light of an unknown polarization is received at a pixel 104 configured and calibrated in accordance with embodiments of the present disclosure, and having a set of grid structures 320 oriented in different directions and associated with different sub-pixels 316 of the pixel 104. The incident light heats the elements 404 of the grid structures 320 differently, depending on the orientation of the grid elements 404, with grid elements 404 having an orientation that is parallel (or more nearly parallel than other grid elements 404) to the polarization direction of the incident light being heated more than grid elements 404 that are not parallel (or that are less parallel) to the polarization direction of the incident light. This heating is used to generate a current in the underlying sub-pixels (908).

The signals generated by the sub-pixels 316 in response to receiving the incident light are read out (step 912), and the ratios of signal strengths between different pairs of the sub-pixels 316 are determined (step 916). The polarization direction of the incident light can then be determined by comparing the ratios of signal strengths obtained by the sub-pixels 316 of the pixel 104 to recorded ratios of signal strengths for different polarization directions of incident light (step 920). In accordance with alternative embodiments of the present disclosure, the polarization direction can be determined by numerically evaluating the obtained signal strengths relative to calibrated values. In accordance with still other embodiments of the present disclosure, the polarization direction can be determined by numerically evaluating the obtained signal strengths and calculating a theoretically determined polarization direction based on expected differential heating of grid structures 320 having different, known orientations. In addition, and intensity of the incident light can be determined by summing the signals from the individual sub-pixels 316 of the pixel 104, and by subtracting a dark current value obtained by a sub-pixel 316 associated with a light shielding member 408 (step 924). The process may then end.

Accordingly, embodiments of the present disclosure enable the polarization direction of long wavelength light incident on a pixel 104 to be determined using a substrate 112 in which photodiodes or sub-pixels 316 are formed using commonly available materials and processes, such as silicon and CMOS production techniques. In particular by intentionally creating a dark current through the heating of absorptive elements 404 formed directly on a light incident surface of a semiconductor substrate 112, a signal can be induced in photodiodes 316 formed in that substrate 112, even where the incident light has a wavelength that is longer than a wavelength that is capable of inducing a photo current in the photodiodes 316. Moreover, an intensity of incident infrared light can be determined even where calibration of polarization angles has not been performed.

In accordance with the least some embodiments of the present disclosure, the sub-pixels 316 of a pixel 104 can be disposed under a single micro lens. In accordance with other embodiments of the present disclosure, the sub-pixels 316 of more than one pixel 104 can all be disposed under the same microlens. A microlens in accordance with embodiments of the present disclosure can be formed from a silicon material. Moreover, an imaging lens can also be formed from a silicon material, in which case a complete solid-state device, with no air gap between the imaging lens and the image sensor 100, can be provided. Where an imaging lens is formed such that it is integral with the image sensor 100, the image sensor can be formed without any micro lenses.

Figure 10:
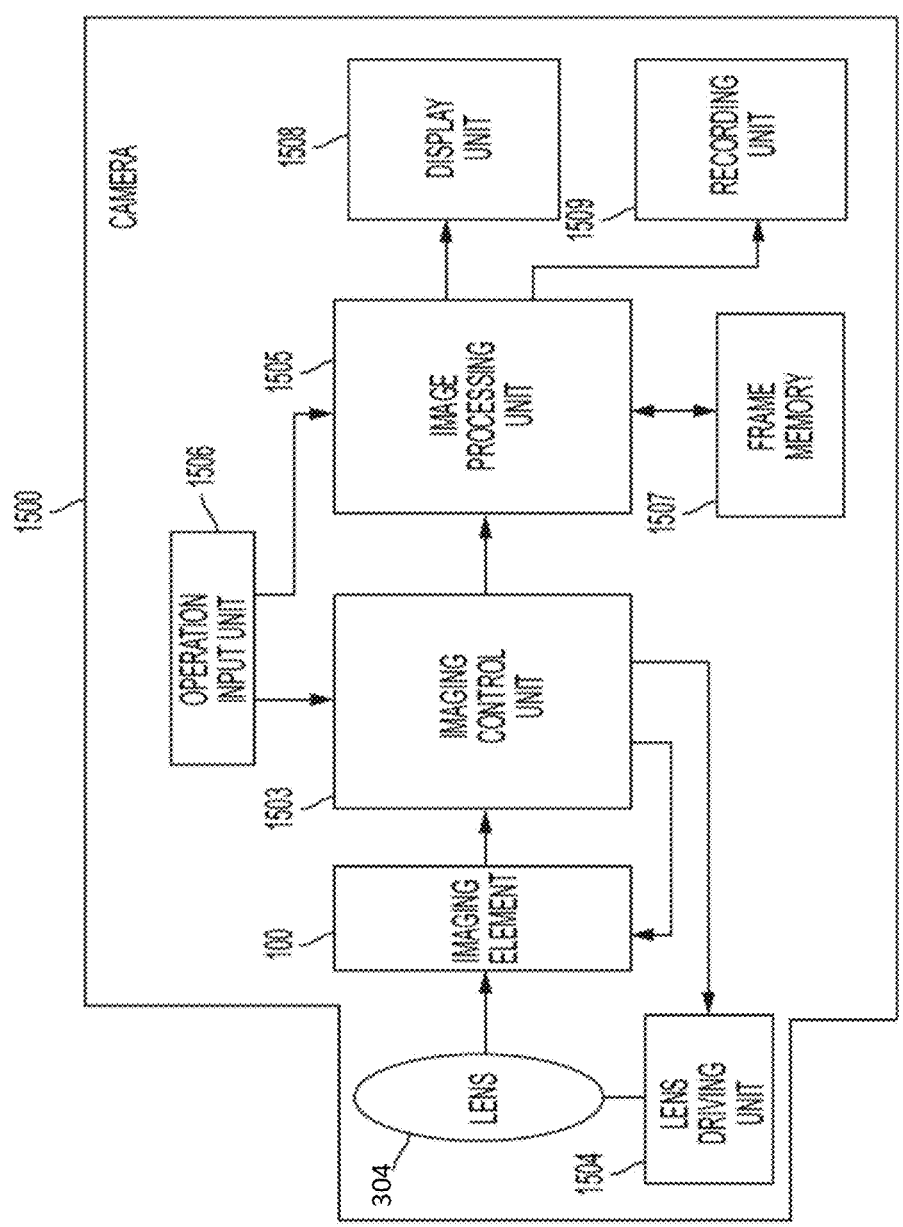
FIG. 10 is a block diagram illustrating a schematic configuration example of a camera that is an example of a device including an image sensor in accordance with embodiments of the present disclosure.

FIG. 10 is a block diagram illustrating a schematic configuration example of a camera 1500 that is an example of an imaging apparatus incorporating a long wavelength polarization sensitive image sensor 100 in accordance with embodiments of the present disclosure can be applied. As depicted in the figure, the camera 1500 includes an optical system or lens 304, an image sensor 100, an imaging control unit 1503, a lens driving unit 1504, an image processing unit 1505, an operation input unit 1506, a frame memory 1507, a display unit 1508, and a recording unit 1509.

The optical system 304 includes an objective lens of the camera 1500. The optical system 304 collects light from within a field of view of the camera 1500, which can encompass a scene containing an object. As can be appreciated by one of skill in the art after consideration of the present disclosure, the field of view is determined by various parameters, including a focal length of the lens, the size of the effective area of the image sensor 100, and the distance of the image sensor 100 from the lens. In addition to a lens, the optical system 304 can include other components, such as a variable aperture and a mechanical shutter. The optical system 304 directs the collected light to the image sensor 100 to form an image of the object on a light incident surface of the image sensor 100.

As discussed elsewhere herein, the image sensor 100 includes a plurality of pixels 104 disposed in an array 108. Moreover, the image sensor 100 can include a semiconductor element or substrate 112 in which the pixels 104 each include a number of sub-pixels 604 that are formed as photosensitive areas or photodiodes within the substrate 112. In addition, as also described elsewhere herein, each pixel 104 includes a plurality of sub-pixels 316, at least some of which are associated with a grid structure 320 that includes electrically floating grid elements 404 disposed directly on a light incident surface of the substrate 112. The photosensitive sites or sub-pixels 316 generate analog signals that are proportional to an amount and polarization of long wavelength light incident thereon. These analog signals can be converted into digital signals in a circuit, such as a column signal processing circuit 120, included as part of the image sensor 100, or in a separate circuit or processor. The digital signals can then be output as a determined intensity, a determined polarization, or a determined intensity and polarization of the incident light.

The imaging control unit 1503 controls imaging operations of the image sensor 100 by generating and outputting control signals to the image sensor 100. Further, the imaging control unit 1503 can perform autofocus in the camera 1500 on the basis of image signals output from the image sensor 100. Here, "autofocus" is a system that detects the focus position of the optical system 304 and automatically adjusts the focus position. For example, a method in which an image plane phase difference is detected by phase difference pixels arranged in the image sensor 100 to detect a focus position (image plane phase difference autofocus) can be used. Further, a method in which a position at which the contrast of an image is highest is detected as a focus position (contrast autofocus) can also be applied. The imaging control unit 1503 adjusts the position of the lens through the lens driving unit 1504 on the basis of the detected focus position, to thereby perform autofocus. Note that the imaging control unit 1503 can include, for example, a DSP (Digital Signal Processor) equipped with firmware.

The lens driving unit 1504 drives the optical system 304 on the basis of control of the imaging control unit 1503. The lens driving unit 1504 can drive the optical system 304 by changing the position of included lens elements using a built-in motor.

The image processing unit 1505 processes image signals generated by the image sensor 100. This processing includes, for example, assigning a polarization direction to infrared light incident on a pixel 104 by determining ratios of signal strengths between pairs of sub-pixels 316 included in the pixel 104, and determining an amplitude of the pixel 104 signal from the individual sub-pixel 316 signal intensities, less a dark current amount determined by a dark sub-pixel 316 included in the pixel, as discussed elsewhere herein. The image processing unit 1505 can include, for example, a microcomputer equipped with firmware, and/or a processor that executes application programming, to implement processes for identifying color information in collected image information as described herein.

The operation input unit 1506 receives operation inputs from a user or other controller of the camera 1500. As the operation input unit 1006, for example, a control interface, a push button or a touch panel can be used. An operation input received by the operation input unit 1506 is transmitted to the imaging control unit 1503 and the image processing unit 1505. After that, processing corresponding to the operation input, for example, the collection and processing of imaging an object or the like, is started.

The frame memory 1507 is a memory configured to store frames that are image signals for one screen or frame of image data. The frame memory 1507 is controlled by the image processing unit 1505 and holds frames in the course of image processing.

The display unit 1508 can display information processed by the image processing unit 1505. For example, a liquid crystal panel can be used as the display unit 1508.

The recording unit 1509 records image data processed by the image processing unit 1505. As the recording unit 1509, for example, a memory card or a hard disk can be used.

An example of a camera 1500 to which embodiments of the present disclosure can be applied has been described above. The image sensor 100 of the camera 1500 can be configured as described herein. Specifically, the image sensor 100 can diffract incident light across different light sensitive areas or sub-pixels 316 of a pixel 104, and can apply ratios of signals from pairs of the sub-pixels 316 to and corresponding stored ratios for a number of different colors, to identify relative contributions of constituent colors, and thus the color of the incident light.

Note that, although a camera has been described as an example of an electronic apparatus, an image sensor 100 and other components, such as processors and memory for executing programming or instructions and for storing calibration information as described herein, can be incorporated into other types of devices. Such devices include, but are not limited to, surveillance systems, automotive sensors, scientific instruments, medical instruments, communication systems, etc.

As can be appreciated by one of skill in the art after consideration of the present disclosure, an image sensor 100 as disclosed herein utilizes the intentional generation of a dark current using selectively oriented conductive lines or grid elements 404 disposed on a light incident surface of a semiconductor substrate 112 in which photodiodes provided as part of sub-pixels 316 are formed to detect the intensity and polarization direction of long wavelength (e.g. greater than 1.0 µm) light. Accordingly, embodiments of the present disclosure enable the detection of long wavelengths of light (e.g., from 1.0 to 10 µm). In addition, an image sensor 100 as disclosed herein can be produced using CMOS processes entirely. Implementations of an image sensor 100 or devices incorporating an image sensor 100 as disclosed herein can utilize calibration tables developed for each pixel 104 of the image sensor 100. Alternatively, calibration tables can be developed for each different pattern of grid elements 320. In addition to providing calibration tables that are specific to particular pixels 104, calibration tables can be developed for use in selected regions of the array 108, or can be applied to all of the pixels 104 within the array 108.

Methods for producing an image sensor 100 in accordance with embodiments of the present disclosure include applying conventional CMOS production processes to produce an array of pixels 104 in an image sensor substrate 112 in which each pixel 104 includes a plurality of sub-pixels or photodiodes 316. As an example, the material of the sensor substrate 112 is silicon (Si), and each sub-pixel 316 is a photodiode formed therein. Grid structures 320 that each include two or more grid elements 404 can be disposed on a light incident surface of the image sensor substrate 112, adjacent at least some of the photodiodes or sub-pixels 316. The grid structures 320 associated with sub-pixels 316 within a pixel 104 can be arranged in pairs, with each pair having a different orientation of included grid elements 404. Moreover, within each grid structure 320 the included grid elements 404 can be provided as thin, parallel lines of material of the same or different lengths. The grid elements 404 can be formed of a material that is absorptive of photons at infrared wavelengths. The grid elements 404 are electrically floating. In accordance with embodiments of the present disclosure, the grid elements are formed such that one surface of each grid element 404 lies directly on the light incident surface of the underlying substrate 112 (e.g., a silicon substrate), and remaining surfaces of the grid element 404 are in contact with an insulating layer 324 (e.g. a silicon oxide layer) that lies over or covers the light incident surface of the substrate 112. Production of an image sensor 100 in accordance with embodiments of the present disclosure can be accomplished using only CMOS processes. Moreover, an image sensor produced in accordance with embodiments of the present disclosure does not require conventional polarization gratings, micro lenses or wavelength selective filters.

The foregoing has been presented for purposes of illustration and description. Further, the description is not intended to limit the disclosed systems and methods to the forms disclosed herein. Consequently, variations and modifications commensurate with the above teachings, within the skill or knowledge of the relevant art, are within the scope of the present disclosure. The embodiments described hereinabove are further intended to explain the best mode presently known of practicing the disclosed systems and methods, and to enable others skilled in the art to utilize the disclosed systems and methods in such or in other embodiments and with various modifications required by the particular application or use. It is intended that the appended claims be construed to include alternative embodiments to the extent permitted by the prior art.

What is claimed is:

1. A sensor device, comprising:
    a sensor substrate;
    a pixel, wherein the pixel includes a plurality of sub-pixels disposed in the sensor substrate, and wherein each of the sub-pixels includes a photodiode; and
    a plurality of grid structures, wherein each grid structure in the plurality of grid structures is disposed on a light incident surface of the sensor substrate in an area corresponding to one of the sub-pixels in the plurality of sub-pixels, wherein each grid structure in the plurality of grid structures includes a plurality of grid elements spaced apart from one another in a direction that is parallel to the light incident surface of the sensor substrate, wherein each grid element in the plurality of grid elements is electrically floating, and wherein each grid element in the plurality of grid elements is disposed directly on the light incident surface of the sensor substrate.

2. The sensor device of claim 1, wherein the grid elements are electrically conductive.

3. The sensor device of claim 2, wherein a material of the grid elements is a metal.

4. The sensor device of claim 1, wherein a material of the grid elements is a silicide.

5. The sensor device of claim 1, wherein each grid structure includes at least two linear grid elements disposed along parallel lines.

6. The sensor device of claim 5, wherein the grid elements in a first one of the grid structures are oriented in a first direction, wherein the grid elements in a second one of the grid structures are oriented in a second direction, wherein the grid elements in a third one of the grid structures are oriented in a third direction, and wherein the grid elements in a fourth one of the grid structures are oriented in a fourth direction.

7. The sensor device of claim 6, wherein the grid elements in a fifth one of the grid structures are oriented in the first direction, wherein the grid elements in a sixth one of the grid structures are oriented in the second direction, wherein the grid elements in a seventh one of the grid structures are oriented in the third direction, and wherein the grid elements in an eighth one of the grid structures are oriented in the fourth direction.

8. The sensor device of claim 7, further comprising:
    a light shield disposed over one of the sub-pixels, wherein the first through eighth grids are disposed adjacent first through eighth sub-pixels included in the plurality of sub-pixels, and wherein the light shield is disposed on a light incident surface side of a ninth sub-pixel included in the plurality of sub-pixels.

9. The sensor device of claim 8, wherein in a plan view the ninth sub-pixel is surrounded by the first through eighth sub-pixels.

10. The sensor device of claim 1, further comprising:
    a light shield, wherein the light shield is further disposed over one of the sub-pixels.

11. The sensor device of claim 10, wherein the light shield is disposed on the light incident surface of the sensor substrate.

12. The sensor device of claim 1, wherein the sensor substrate is silicon.

13. The sensor device of claim 1, further comprising:
    an insulating layer, wherein the insulating layer is disposed on the light incident surface of the sensor substrate, and wherein the insulating layer covers the grid elements.

14. The sensor device of claim 1, wherein at least a portion of the grid elements are covered by an anti-reflective material.

15. The sensor device of claim 1, wherein each grid structure includes two grid elements.

16. The sensor of claim 15, wherein the grid elements are formed as parallel lines of an electrically conductive material.

17. The sensor device of claim 1, further comprising:
    a microlens, wherein the microlens is disposed on a light incident side of the pixel, and wherein the microlens passes incident infrared light to each of the sub-pixels.

18. An electronic device, comprising:
   a lens;
   a long wavelength polarization sensitive image sensor, including:
      a sensor substrate;
   a plurality of pixels, wherein at least some of the pixels in the plurality of pixels includes:
      a plurality of sub-pixels; and
      a plurality of grid structures, wherein each grid structure in the plurality of grid structures is disposed on a light incident surface of the sensor substrate in an area corresponding to one of the sub-pixels in the plurality of sub-pixels, wherein each grid structure in the plurality of grid structures includes a plurality of grid elements spaced apart from one another in a direction that is parallel to the light incident surface of the sensor substrate, wherein each grid element in the plurality of grid elements is electrically floating, wherein each of the grid elements is disposed directly on the light incident surface of the sensor substrate, wherein, in response to exposure to light, the grid elements are heated and generate a dark current in the corresponding sub-pixels, and wherein the electronic device provides an output indicating a polarization of the light based on relative amounts of dark current in the sub-pixels.

19. A method for sensing a polarization of infrared light, comprising:
   providing a plurality of sub-pixels, wherein each of the sub-pixels includes a photodiode formed in a sensor substrate;
   providing a plurality of grid structures, wherein each grid structure includes a plurality of grid elements formed on a light incident surface of the sensor substrate, wherein each grid structure in the plurality of grid structures is disposed adjacent one of the sub-pixels, wherein at least some of the grid structures include grid elements that are oriented differently from grid elements included in other of the grid structures, and wherein each grid element is electrically floating;
   exposing the sub-pixels to infrared light, whereby the grid elements are heated and generate a dark current in the adjacent sub-pixel; and
   detecting a current in each sub-pixel in the plurality of sub-pixels.

\* \* \* \* \*